(12) United States Patent
Sohn et al.

(10) Patent No.: US 7,947,896 B2
(45) Date of Patent: May 24, 2011

(54) METHOD FOR MODIFYING SURFACE OF COUNTER ELECTRODE AND SURFACE-MODIFIED COUNTER ELECTRODE

(75) Inventors: Byung-Hee Sohn, Yongin-si (KR); Sang Cheol Park, Seoul (KR); Yong Soo Kang, Seoul (KR); Young Gun Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 649 days.

(21) Appl. No.: 11/696,980

(22) Filed: Apr. 5, 2007

(65) Prior Publication Data

US 2007/0289628 A1    Dec. 20, 2007

(30) Foreign Application Priority Data

Jun. 19, 2006  (KR) .................. 10-2006-0054801

(51) Int. Cl.
*H01L 31/0224* (2006.01)
(52) U.S. Cl. .......... 136/256; 136/252; 136/264; 438/57; 438/98
(58) Field of Classification Search .......... 136/252–265; 257/40; 438/99
See application file for complete search history.

(56) References Cited

U.S. PATENT DOCUMENTS

2004/0163700 A1* 8/2004 Mizuta et al. ............... 136/263
2005/0285101 A1* 12/2005 Hanson et al. ............... 257/40
2007/0119048 A1* 5/2007 Li et al. ...................... 29/623.5

OTHER PUBLICATIONS

Zhang et al., Voltametric Behavior of Noradrenaline at 2-Mercaptoethanol Self-Assembled Monolayer Modified Gold Electrode and its Analytical Application, Chemistry and Material Science, Hubei University, Sensors, vol. 3, pp. 61-68, 2003.*
Wang et al. (A Novel High-Performance Counter Electrode for Dye-Sensitized Solar Cells, Institute of Chemistry, Chinese Academy of Scineces, Electrochimica Acta, vol. 50, pp. 5546-5552, 2005.*
Nogueira, et al; "Bye-Sensitized Nanocrystalline Solar Cells Employing a Polymer Electrolyte"; Adv. Mater.; 13; pp. 826-830; Jun. 5, 2001.

* cited by examiner

*Primary Examiner* — Jennifer K. Michener
*Assistant Examiner* — Jayne Mershon
(74) *Attorney, Agent, or Firm* — Cantor Colburn LLP

(57) ABSTRACT

Disclosed herein is a method for modifying the surface of a counter electrode. According to the method, the surface modification is achieved by treating the surface of a counter electrode with a polyethylene glycol derivative having a pendant group at one end. Also disclosed is a counter electrode whose surface is modified by the method. The electron transfer rate at the interface between the counter electrode and an electrolyte layer of a photovoltaic device is increased and the affinity of the counter electrode for the electrolyte layer is improved, resulting in an improvement in the power conversion efficiency of the photovoltaic device.

6 Claims, 3 Drawing Sheets

METHOD FOR MODIFYING SURFACE OF COUNTER ELECTRODE AND SURFACE-MODIFIED COUNTER ELECTRODE

This application claims priority to Korean Patent Application No. 2006-54801 filed on Jun. 19, 2006, and all the benefits accruing therefrom under 35 U.S.C. §119, the contents of which are herein incorporated by reference in its entirety.

BACKGROUND OF THE INVENTION

1. Field of the Invention

The present invention relates to a method for modifying the surface of a counter electrode, and a counter electrode whose surface is modified by the method. More specifically, the present invention relates to a method for modifying the surface of a counter electrode by treating the surface of the counter electrode with a polyethylene glycol derivative having a pendant group at one end, thereby achieving an increased electron transfer rate at the interface between the counter electrode and an electrolyte layer of a photovoltaic device and improved affinity of the counter electrode for the electrolyte layer; and a counter electrode whose surface is modified by the method.

2. Description of the Related Art

Since solar cells, which constitute one type of photovoltaic device for converting solar energy into electric energy, utilize virtually inexhaustible solar energy, unlike other energy sources, and are environmentally friendly, they are gradually gaining importance. Particularly, when solar cells are used as power sources in portable digital communication devices, such as portable computers, cellular phones, and personal digital assistants (PDAs), they are expected to be charged by solar power only.

Monocrystalline or polycrystalline silicon-based solar cells have extensively been used. However, silicon-based solar cells require the use of large, expensive equipment and costly raw materials, incurring considerable fabrication costs. In addition, silicon-based solar cells suffer from numerous difficulties in improving the conversion efficiency of solar energy into electric energy.

Under such circumstances, there has been increasing interest in solar cells using organic materials that can be fabricated at reduced costs. Particularly, dye-sensitized solar cells have received a great deal of attention owing to their low fabrication costs.

Dye-sensitized photovoltaic devices are photoelectrochemical solar cells which comprise, for example, a semiconductor electrode including a transparent electrode, a porous semiconductor layer formed of nanoparticles adhered to the transparent electrode, and a dye coated on the surface of the porous semiconductor layer; a counter electrode arranged opposite to the semiconductor electrode; and a redox electrolytic solution disposed in a space between the two electrodes. The advantages of dye-sensitized solar cells are high power conversion efficiency and low fabrication costs.

However, since dye-sensitized solar cells are wet cells using a liquid electrolyte, leakage or volatilization of the electrolyte solution may occur during long-term use of the solar cells, causing problems of low reliability and poor long-term stability (e.g., rapid decrease in power conversion efficiency) of the solar cells.

To solve these problems associated with wet solar cells, research has been conducted to replace liquid electrolytes with solid electrolytes or quasi-solid hole conductors. One of the first solar cells using a solid polymer electrolyte as a hole transport material was developed by De Paoli's research group in Brazil in 2001, and thereafter, there has been much research aimed at the development of solar cells using solid polymer electrolytes.

However, solar cells using polymer electrolytes have low energy conversion efficiencies, which makes them undesirable for commercialization. Further, solar cells using polymer electrolytes have low ionic conductivities as compared to solar cells using liquid electrolytes. When the polymer electrolyte of the solar cell includes a polymer having a long molecular chain, it is difficult for the polymer electrolyte to infiltrate into pores formed between the nanometer-sized semiconductor particles. In addition, if the polymer electrolyte insufficiently surrounds the semiconductor nanoparticles and does not provide a complete connection to the semiconductor nanoparticles without any electrical shorting, the current density of the solar cell is greatly decreased. Alternatively, when the polymer electrolyte of the solar cell includes a liquid- or wax-phase polymer having a short molecular chain, the mechanical properties of the solar cell can be deteriorated and leakage of the electrolyte inevitably occurs as in wet solar cells.

A dye-sensitized solar cell includes two interfaces (i.e., a semiconductor electrode/electrolyte interface and a counter electrode/electrolyte interface). The performance of the solar cell is largely dependent upon the electron transfer rate and reduction rate at the interfaces. Particularly, since a solid polymer and a metal constitute the counter electrode/electrolyte interface of the solar cell, incomplete contact between the solid materials is caused. This incomplete contact makes the transfer of electrons between the counter electrode and the electrolyte layer difficult as compared to when a liquid electrolyte is used, thus leading to a reduction in the power conversion efficiency of the solar cell.

BRIEF SUMMARY OF THE INVENTION

The present invention overcomes the problems of the prior art, and one aspect of the present invention includes providing a method for modifying the surface of a counter electrode by treating the surface of the counter electrode with a polyethylene glycol derivative having a pendant group (e.g., a thiol group) at one end to improve the affinity of the counter electrode for a polymer electrolyte, so that the interface resistance between the counter electrode and the polymer electrolyte is decreased and the electron transfer rate at the interface is increased, thus achieving improved energy conversion efficiency.

Another aspect of the present invention includes providing a counter electrode for a photovoltaic device whose surface is modified so as to improve the affinity of the counter electrode for a polymer electrolyte.

Yet another aspect of the present invention includes providing a photovoltaic device with high energy conversion efficiency in which a counter electrode has a high affinity for an electrolyte.

In accordance with an exemplary embodiment of the present invention, a method for modifying the surface of a counter electrode includes disposing an electrically conductive material on a substrate to form a conductive layer and modifying the surface of the conductive layer with a compound represented by Formula 1 below:

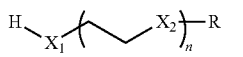

(1)

wherein R is H or OH, $X_1$ is S, Se or Te, $X_2$ is O, S, Se or Te, and n is an integer from 1 to 40.

In accordance with another exemplary embodiment of the present invention, a surface-modified counter electrode includes a substrate, a conductive layer formed on the substrate, and a surface-modification coating layer formed on the conductive layer wherein the conductive layer is formed of an electrically conductive material and the surface-modification coating layer is formed from a compound represented by Formula 1 below:

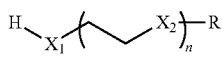

(1)

wherein R is H or OH, $X_1$ is S, Se or Te, $X_2$ is O, S, Se or Te, and n is an integer from 1 to 40.

In accordance with yet another exemplary embodiment of the present invention, a photovoltaic device includes the surface-modified counter electrode.

The photovoltaic device can be a solid dye-sensitized photovoltaic device.

BRIEF DESCRIPTION OF THE DRAWINGS

The above and other aspects, features, and other advantages of the present invention will be more clearly understood from the following detailed description taken in conjunction with the accompanying drawings, in which.

DETAILED DESCRIPTION OF THE INVENTION

Figure 1:
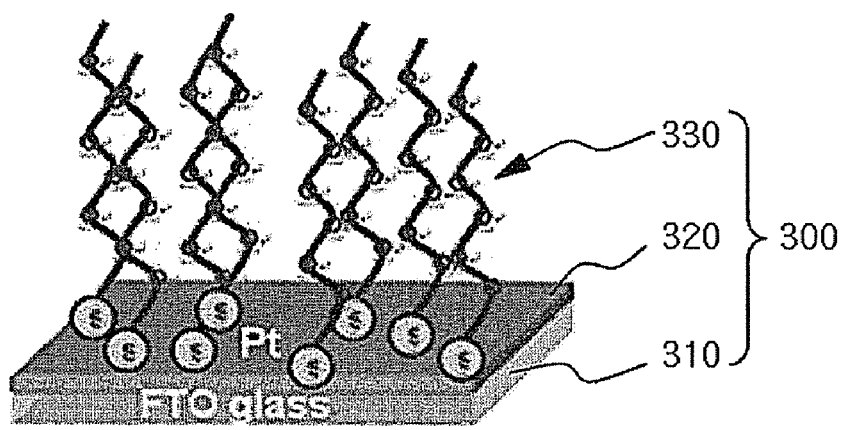
FIG. 1 is a schematic illustration of a state in which the surface of a counter electrode is modified by an exemplary embodiment of a method according to the present invention.

The present invention will now be described more fully hereinafter with reference to the accompanying drawings, in which exemplary embodiments of the present invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise", "comprises", and "comprising," when used in this specification, specify the presence of stated features, integers, steps, operations, elements, components, and/or combination of the foregoing, but do not preclude the presence and/or addition of one or more other features, integers, steps, operations, elements, components, groups, and/or combination of the foregoing.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In an exemplary embodiment, a method for modifying the surface of a counter electrode according to the present invention is characterized in that the counter electrode is surface-modified with a polyethylene glycol derivative having a pendant group at one end.

Specifically, an exemplary embodiment of the method of the present invention includes coating an electrically conductive material on a substrate to form a conductive layer and modifying the surface of the conductive layer with a compound represented by Formula 1 below:

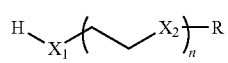

(1)

wherein R is H or OH, $X_1$ is S, Se or Te, $X_2$ is O, S, Se or Te, and n is an integer from 1 to 40.

The counter electrode includes a substrate and an electrically conductive material coated on the substrate. Non-limiting examples of the electrochemically conductive material include highly reflective materials, such as platinum, gold, carbon, and carbon nanotubes (CNTs). In an exemplary embodiment, platinum (Pt) is used.

For better surface modification of the counter electrode, the compound of Formula 1 wherein $X_1$ is sulfur and $X_2$ is oxygen is used.

The substrate may be of any type so long as it is transparent, and examples thereof include transparent inorganic substrates, such as quartz and glass, and transparent polymeric substrates, such as polyethylene terephthalate (PET), polyethylene naphthalate (PEN), polycarbonate, polystyrene, and polypropylene.

The surface modification of the counter electrode can be achieved by coating the surface of the counter electrode with a coating solution containing the compound of Formula 1 by a coating technique selected from the group consisting of dip coating, spin coating, screen printing, spray coating, roll coating, blade coating, gravure coating, and doctor blading.

After coating, the coating solution containing the polyethylene glycol derivative having a pendant group is dried. The drying may be performed without any particular limitation by general techniques. In an exemplary embodiment, the drying may be performed by slowly evaporating the solvent of the coating solution at atmospheric pressure and room temperature for at least 24 hours, followed by vacuum drying ($\sim 10^{-2}$ torr) for 2 hours.

Examples of solvents that can be used to prepare the coating solution include, but are not limited to, water; alcohols such as methanol, ethanol, isopropyl alcohol, propyl alcohol, and butanol; ketones such as acetone, methyl ethyl ketone, ethyl isobutyl ketone, and methyl isobutyl ketone; ethylene glycols such as ethylene glycol, ethylene glycol methyl ether, and ethylene glycol mono-n-propyl ether; propylene glycols such as propylene glycol, propylene glycol methyl ether, propylene glycol ethyl ether, propylene glycol butyl ether, and propylene glycol propyl ether; amides such as dimethylformamide and dimethylacetamide; pyrrolidones such as N-methylpyrrolidone and N-ethylpyrrolidone; dimethylsulfoxide; γ-butyrolactone; hydroxyesters such as methyl lactate, ethyl lactate, methyl β-methoxyisobutyrate, and methyl α-hydroxyisobutyrate; anilines such as aniline and N-methylaniline; hexane; terpineol; chloroform; toluene; propylene glycol monomethyl ether acetate (PGMEA); and N-methyl-2-pyrrolidone (NMP).

In another exemplary embodiment, the present invention is directed to a surface-modified counter electrode. FIG. 1 is a schematic illustration of an exemplary embodiment of a surface-modified counter electrode according to the present invention. Referring to FIG. 1, the counter electrode 300 comprises a substrate 310, a conductive layer 320 formed on the substrate 310, and a surface-modification coating layer 330 formed on the conductive layer 320 wherein the conductive layer 320 is formed from an electrically conductive material and the coating layer 330 is formed from a compound having a pendant group represented by Formula 1 below:

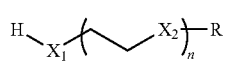

(1)

wherein R is hydrogen or OH, $X_1$ is S, Se or Te, $X_2$ is O, S, Se or Te, and n is an integer from 1 to 40.

In an exemplary embodiment, the compound of Formula 1 includes a thiol pendant group. That is, the compound of Formula 1 is preferably a compound wherein $X_1$ is sulfur and $X_2$ is oxygen.

The counter electrode can include, without limitation, an electrically conductive material. So long as a conductive layer is disposed on the surface of the counter electrode facing a semiconductor electrode, any insulating material may be used to form the counter electrode. It is desirable to use an electrochemically stable material to form the counter electrode. Specific examples of electrochemically stable materials include platinum, gold, carbon, and carbon nanotubes (CNTs) For the purpose of improving the catalytic effects of oxidation and reduction, the surface of the counter electrode facing the transparent electrode has a microstructure with an increased surface area. For example, in an exemplary embodiment, the counter electrode comprises platinum black or porous carbon.

As shown in FIG. 1, when the counter electrode surface-modified with the polyethylene glycol derivative having a pendant group (for example, a thiol group) at one end is employed to fabricate a photovoltaic device, the pendant group is bound to the counter electrode, e.g., a platinum electrode, to form a specific structure, such as a self-assembled monolayer (SAM). For example, a platinum electrode is treated with the polyethylene glycol derivative having a thiol group at one end to form platinum-sulfur bonds, as depicted in Reaction 1 below. The platinum-sulfur bonds serve to improve the affinity of the counter electrode for an electrolyte layer.

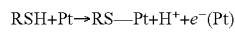

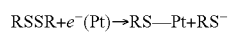   Reaction 1

The morphology of the polyethylene glycol chain having a pendant group increases the specific surface area and the roughness of the counter electrode. As a result, the interface resistance between the counter electrode and the electrolyte layer is decreased, resulting in an increase in the electron transfer rate at the interface between the counter electrode and the electrolyte layer. According to the surface-modified counter electrode for a photovoltaic device, the electron transfer rate at the interface between the counter electrode and the electrolyte layer is increased and the affinity of the counter electrode for the electrolyte layer is improved, resulting in an improvement in the power conversion efficiency of the photovoltaic device. Better surface modification effects of the counter electrode can be achieved by varying various conditions, which allows the surface-modified counter electrode of the present invention to have a high value as an electrode for photovoltaic devices, including solar cells.

The surface-modified counter electrode of the present invention can be used as a counter electrode of a photovoltaic device and specifically a dye-sensitized photovoltaic device. Particularly, when the surface-modified counter electrode of the present invention is applied to a solid dye-sensitized photovoltaic device, the interface resistance between the counter electrode and a polymer electrolyte is decreased, thus achieving increased current density of the dye-sensitized photovoltaic device.

Figure 2:
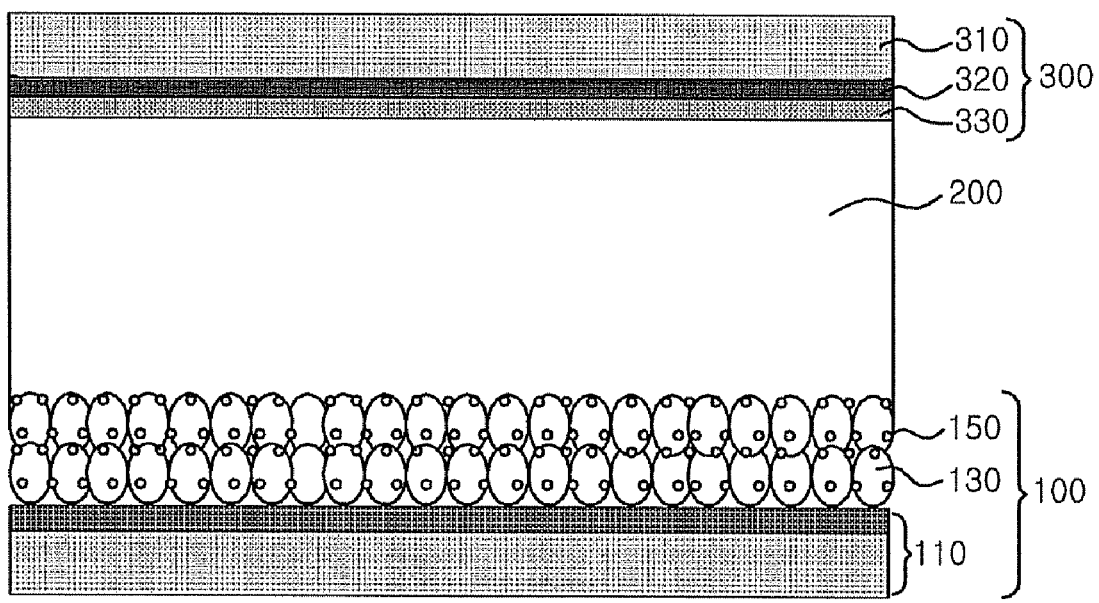
FIG. 2 is a schematic illustration of a cross-section of an exemplary embodiment of a photovoltaic device including a counter electrode of the present invention.

FIG. 2 is a schematic illustration of a cross-section of an exemplary embodiment of a photovoltaic device comprising the surface-modified counter electrode of the present invention.

Referring to FIG. 2, the photovoltaic device of the present invention comprises a semiconductor electrode 100 including a transparent electrode 110 composed of a substrate and a conductive material coated on the substrate, a metal oxide layer 130 formed on the transparent electrode, and a dye 150 adsorbed on the surface of the metal oxide layer 130; a counter electrode 300 arranged opposite to the semiconductor electrode 100; and an electrolyte layer 200 formed between the semiconductor electrode 100 and the counter electrode 300.

The transparent electrode 110 of the photovoltaic device according to the present invention is formed by coating an electrically conductive material on a substrate. The substrate may be of any type so long as it is transparent, and examples thereof include transparent inorganic substrates, such as quartz and glass, and transparent polymeric substrates, such as polyethylene terephthalate, polyethylene naphthalate, polycarbonate, polystyrene, and polypropylene.

As the conductive material coated on the substrate, there can be used, for example, tin-doped indium oxide (ITO), fluorine-doped tin oxide (FTO), $ZnO$—$Ga_2O_3$, $ZnO$—$Al_2O_3$, or $SnO_2$—$Sb_2O_3$.

A light-absorbing layer of the photovoltaic device according to the present invention includes the metal oxide layer 130 and a dye 150 adsorbed on the surface of the metal oxide layer 130. The light-absorbing layer absorbs as much light as possible to attain a high efficiency. To this end, a porous metal oxide with extended surface area is used as a material for the metal oxide layer, and the dye is adsorbed within pores of the porous metal oxide.

The metal oxide layer 130 is formed from at least one metal oxide selected from the group consisting of, but not limited to, an oxide of titanium, niobium, hafnium, indium, tungsten, tin and zinc. These metal oxides may be used alone or in combination thereof. Exemplary metal oxides include $TiO_2$, $SnO_2$, $ZnO$, $WO_3$, $Nb_2O_5$, and $TiSrO_3$. A particularly exemplary oxide is anatase-type $TiO_2$.

The metal oxide layer 130 desirably has a large surface area so that the dye 150 adsorbed on the surface of the metal oxide layer absorbs as much light as possible and the degree of adsorption to the electrolyte layer 200 is increased. In an exemplary embodiment, the metal oxide has a nanostructure selected from nanotubes, nanowires, nanobelts, and nanoparticles.

The particle diameter of the metal oxide is not especially limited. The metal oxide has an average particle diameter of about 1 nanometer (nm) to about 200 nm, and specifically about 5 nm to about 100 nm. If desired, two or more kinds of metal oxides having different particle sizes may be mixed to scatter incident light and improve the quantum yield.

Any dye material that can be generally used in the field of photovoltaic devices may be used without limitation as the dye 150. Ruthenium complexes are preferred. In addition to ruthenium complexes, any dye that has a charge separation function and is photosensitive can be used. Specific dyes include xanthene dyes such as Rhodamine B, Rose Bengal, eosin, and erythrosine; cyanine dyes such as quinocyanine and cryptocyanine; basic dyes such as phenosafranine, Capri blue, thiosine, and Methylene Blue; porphyrin compounds such as chlorophyll, zinc porphyrin, and magnesium porphyrin; azo dyes; complex compounds such as phthalocyanine compounds and ruthenium trisbipyridyl; anthraquinone dyes; polycyclic quinone dyes; and the like. These dyes may be used alone or in combinations.

The counter electrode 300 of the photovoltaic device according to the present invention can include, without limitation, an electrically conductive material. So long as a conductive layer is disposed on the surface of the counter electrode facing the semiconductor electrode, any insulating material may be used to form the counter electrode. It is desirably to use an electrochemically stable material to form the counter electrode. Specific examples of electrochemically stable materials include platinum, gold, carbon, and carbon nanotubes (CNTs).

An electrolyte of the electrolyte layer 200 of the photovoltaic device according to the present invention may be a solid electrolyte or a gel-type electrolyte containing ions that may undergo redox reactions. The gel-type electrolyte may include a crosslinked matrix and an electrolyte composition containing a solvent, and the polymer electrolyte may include a crosslinked matrix. Since the electrolyte layer includes a gel-type electrolyte or a completely solid electrolyte, no leakage or volatilization of the electrolyte solution occurs. Accordingly, the electrolyte used in the photovoltaic device of the present invention causes virtually no deterioration in the characteristics of the photovoltaic device and is thus highly reliable.

The operation of the photovoltaic device according to the present invention will be described below. The dye adsorbed on the surface of the metal oxide layer absorbs light incident on the surface of the light-absorbing layer, and undergoes electronic transitions from the ground state to the excited state to form electron-hole pairs. The excited electrons are injected into a conduction band of the metal oxide and transferred to the electrode to generate an electromotive force. When electrons generated from the dye by photoluminescence are transferred to a conduction band of the metal oxide, the dye that loses electrons receives electrons from a hole transport material of the electrolyte layer, after which it returns to the ground state.

Any process may be employed to fabricate the photovoltaic device of the present invention. First, a transparent electrode coated with an electrically conductive material is prepared. A metal oxide semiconductor layer is formed on one surface of the transparent electrode.

Taking the desired physical properties, ease of formation and formation costs into consideration, the formation of the metal oxide layer is desirably achieved by a wet process. Specifically, a metal oxide powder is homogeneously dispersed in a suitable solvent to prepare a paste. The paste is coated on a transparent conductive film, which is formed on a substrate. At this time, the coating may be carried out by general coating techniques, for example, spraying, spin coating, dipping, printing, doctor blading and sputtering, and electrophoresis.

The formation of the metal oxide layer by the coating technique involves drying and baking after coating. The drying can be performed, for example, at about 50 degrees Celsius (° C.) to about 100° C., and the baking can be performed at about 400° C. to about 500° C.

Next, the metal oxide layer is impregnated with a solution containing a photosensitive dye for at least about 12 hours to adsorb the dye on the surface of the metal oxide. Examples of suitable solvents that can be used in the solution containing a photosensitive dye include tert-butyl alcohol, acetonitrile, and a mixture thereof.

Any process may be employed to modify the surface of the counter electrode so long as the compound of Formula 1 serves to improve the adhesion of the counter electrode to the electrolyte layer, and examples thereof include spin coating, dipping, spraying, roll coating, blade coating, gravure coating, screen coating, doctor blading and electrophoresis.

Figure 3:
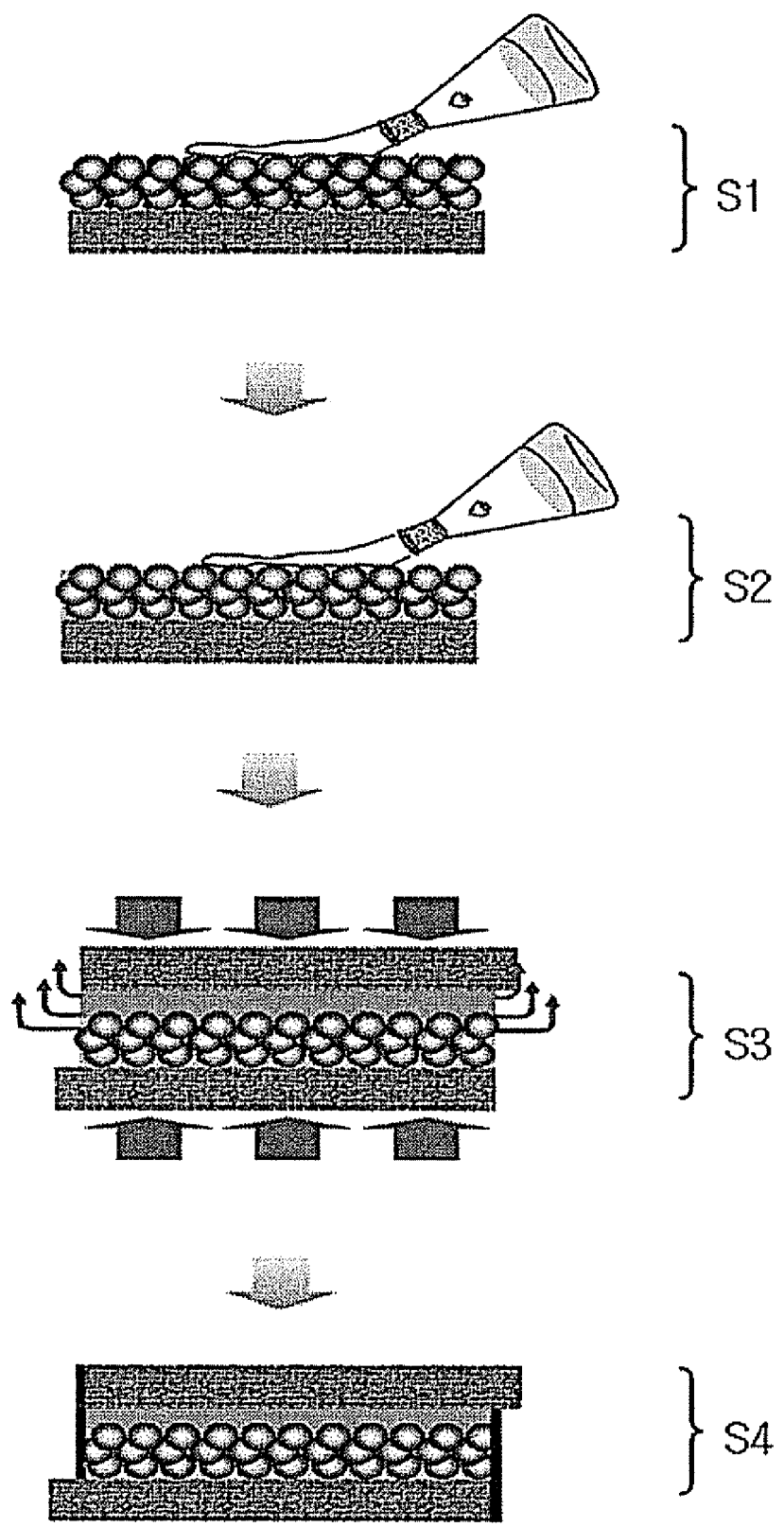
FIG. 3 is a process flow diagram illustrating an exemplary embodiment of a method for the fabrication of a photovoltaic device according to the present invention.

A solid dye-sensitized photovoltaic device can be fabricated in accordance with the following procedure. As shown in FIG. 3, infiltration of a polymer electrolyte into pores of a metal oxide layer generally involves a two-stage procedure. First, a diluted polymer solution in a sol state is uniformly infiltrated into pores of a metal oxide layer, and dried (S1). Subsequently, a concentrated polymer solution is infiltrated into the pores and dried to form a gel-type polymer electrolyte layer (S2). The polymer electrolyte layer is bound to the surface-modified counter electrode (S3) to produce an assembly. After complete removal of the solvents, the assembly is sealed to complete the fabrication of the photovoltaic device (S4).

Hereinafter, the present invention will be explained in more detail with reference to the following examples. However, these examples are given for the purpose of illustration and are not to be construed as limiting the scope of the invention.

EXAMPLES

Examples 1 to 4

Fabrication of Test Devices

After fluorine-doped tin oxide (FTO) was sputtered on a glass substrate, a paste of anatase-type $TiO_2$ particles having an average particle diameter of about 13 nm was coated thereon by screen printing and dried at about 70° C. for about 30 minutes. After completion of the drying, the resulting structure was placed in an electric furnace, heated at a rate of about 3 degrees Celsius per minute (° C./min) in air, maintained at about 450° C. for about 30 minutes, and cooled at a rate of about 3° C./min to form a porous $TiO_2$ film having a thickness of about 12 micrometers (μm). Subsequently, the glass substrate, on which the metal oxide layer was formed, was dipped in an about 30 millimolar (mM) solution of a cis-bis(isothiocyanato)bis(2,2'-bipyridyl-4,4'-dicarboxylato)-ruthenium(II) bis-tetrabutylammonium dye (N719, Solaronix) in t-butanol and acetonitrile (1:1 (v/v)) for about 24 hours and dried to adsorb the dye on the surface of the $TiO_2$ layer. After completion of the adsorption, ethanol was sprayed on the layer to remove the unadsorbed dye, and dried.

Polyethylene glycol-SH compounds having different molecular weights ($M_w$: 1K, 2K and 5K, SunBio, Inc.) were dissolved in ethanol as a solvent at about 40° C. to prepare about 0.1 mM (Example 4), about 0.5 mM (Example 3), about 1 mM (Example 2) and about 2 mM (Example 1) solutions, respectively. An about 0.03M $H_2PtCl_6$ solution in isopropyl alcohol (IPA) was spin-coated on a substrate, and baked at about 450° C. for about 30 minutes to produce a platinum counter electrode. Platinum counter electrodes were independently dipped in each of the PEG-SH solutions for about 24 hours to coat the surface of the platinum counter electrode with the coating solution, allowed to stand at atmospheric pressure and room temperature for about 24 hours, and dried under a vacuum of about $10^{-2}$ torr for about 2 hours.

On the other hand, KI and $I_2$ were dissolved in polyethylene glycol dimethyl ether ($M_w$=500) and acetonitrile, respectively, and then the solutions were mixed. At this time, the KI was used in an amount of about 0.5 weight percent (wt %) and the $I_2$ was used in an amount of about 10 wt % with respect to the weight of the KI. To the mixed solution, fumed silica was added in an amount of about 9 wt % with respect to the total weight of the KI and the $I_2$ and homogeneously dispersed to prepare a polymer electrolyte.

The electrolyte was infiltrated into pores of the $TiO_2$ layer and the solvents were removed under a nitrogen atmosphere at about 40° C. for about 24 hours to form a gel-type polymer electrolyte. After the polymer electrolyte was bound to the counter electrode, trace amounts of the solvents were removed under vacuum to complete the fabrication of the dye-sensitized photovoltaic devices.

Comparative Example 1

A photovoltaic test device was fabricated in the same manner as in Examples 1 to 4, except that no surface modification of the counter electrode was performed.

Test Example 1

Evaluation of Characteristics of Test Devices

The photovoltages and photocurrents of the devices fabricated in Examples 1 to 4 and Comparative Example 1 were measured to calculate the power conversion efficiency of the devices. For the measurements, a xenon lamp (01193, Oriel) was used as a light source, and a standard photovoltaic device (Frunhofer Institute Solar Engeriessysteme, Certificate No. C—ISE369, Type of material: Mono-Si$^+$ KG filter) was used to calibrate the solar conditions (AM 1.5) of the xenon lamp. The photocurrent density ($I_{sc}$), open-circuit voltage ($V_{oc}$) and fill factor (FF) of the photovoltaic devices were determined from the obtained photocurrent-photovoltage curves, and the power conversion efficiency ($\eta_e$) of the photovoltaic devices was calculated according to the following equation:

$$\eta_e(\%)=(V_{oc} \cdot I_{sc} \cdot FF)/(P_{inc}) \times 100$$

where $P_{inc}$ is 100 mw/cm$^2$ (1 sun).

Figure 4:
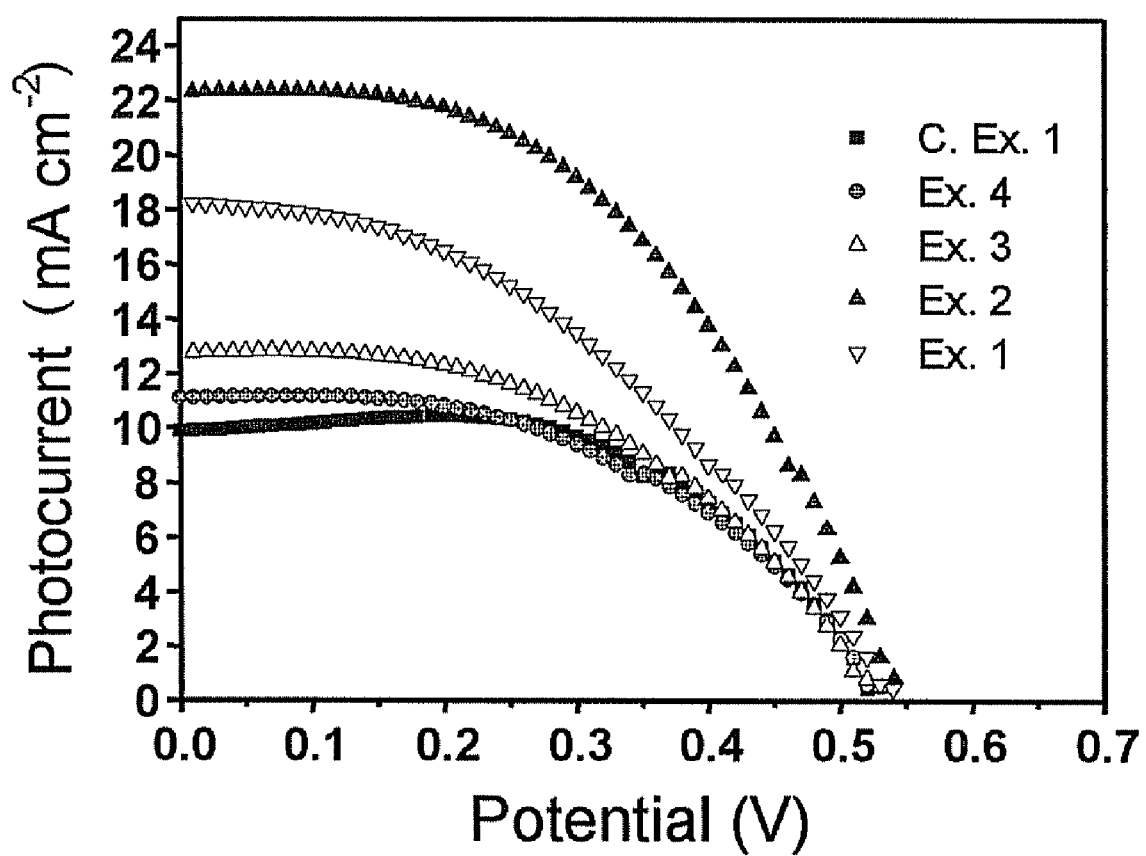
FIG. 4 is a graph showing the current-voltage characteristics of photovoltaic devices fabricated in Examples 1-4 and Comparative Example 1 of the present invention.

The obtained results are shown in Table 1. In addition, FIG. 4 is a graph showing the current-voltage (I-V) characteristics of the photovoltaic devices.

TABLE 1

| Example No. | $I_{sc}$ (mA) | $V_{oc}$ (mV) | FF | Power conversion efficiency (%) |
|---|---|---|---|---|
| Comparative Example 1 | 0.530 | 9.902 | 0.589 | 3.090 |
| Example 1 | 0.540 | 11.130 | 0.489 | 2.941 |
| Example 2 | 0.530 | 12.750 | 0.476 | 3.214 |
| Example 3 | 0.550 | 22.275 | 0.483 | 5.919 |
| Example 4 | 0.545 | 18.240 | 0.408 | 4.056 |

As seen in the results of Table 1, the device fabricated in Comparative Example 1, which does not comprise a surface-modified counter electrode, exhibited a power conversion efficiency of 3.090%, whereas the device fabricated in Example 3, which comprises a Pt counter electrode treated with the about 0.5 mM polyethylene glycol-SH solution, exhibited a higher power conversion efficiency of 5.919%.

The I-V characteristics of the photovoltaic devices demonstrate that the use of the surface-modified counter electrodes lowers the interface resistance, resulting in a marked improvement in the current density of the devices. That is, the devices showed an increase in photocurrent density and few changes in open-circuit voltage. Accordingly, the surface modification of the counter electrodes according to the method of the present invention leads to an improvement in the efficiency of the photovoltaic devices.

Test Example 2

Measurement of Coating Ability

PEG-SH was dissolved in water and ethanol to prepare coating solutions having the concentrations indicated in accordance with Table 2. Contact angles of a surface-unmodified platinum electrode and the surface-modification layers were measured, and the results are shown in Table 2.

TABLE 2

| Coating of PEG-SH on platinum counter electrode | Contact angle (°) |
| --- | --- |
| Pure platinum electrode | 55-65 |
| H$_2$O (0.5 mM) | 25 |
| H$_2$O (1 mM) | 20 |
| EtOH (0.5 mM) | 10 |
| EtOH (1 mM) | 12-14 |

The results of Table 2 show that the treatment of the Pt counter electrodes with the PEG-SH caused decreased contact angles when compared to the contact angle of the surface-unmodified Pt counter electrode, which indicates increased hydrophilicity of the Pt counter electrodes with the PEG-SH. The Pt counter electrodes, which were coated with the PEG-SH solutions in water as a solvent, showed decreased contact angle and increased hydrophilicity with increasing dilution concentration. Better results were obtained in the Pt counter electrodes coated with the PEG-SH solutions in ethanol as a solvent.

The surface modification of a counter electrode by the method of the present invention promotes the transfer of electrons at the interface between the counter electrode and a polymer electrolyte of a dye-sensitized photovoltaic device, leading to a reduction in the interface resistance of the photovoltaic device. The reduced interface resistance increases the current density of the photovoltaic device and, as a result, the redox reaction rate of the photovoltaic device is increased, thus achieving an improved energy conversion efficiency of the photovoltaic device.

In addition, since better surface modification effects of the counter electrode can be achieved by optimizing various conditions, the surface-modified counter electrode of the present invention has a high value as an electrode for photovoltaic devices.

Although the present invention has been described with reference to the foregoing exemplary embodiments, these exemplary embodiments do not serve to limit the scope of the present invention. Accordingly, those skilled in the art to which the present invention pertains will appreciate that various modifications, additions, and substitutions are possible, without departing from the scope and spirit of the accompanying claims.

What is claimed is:

1. A surface-modified counter electrode, comprising:
    a substrate;
    a conductive layer formed on the substrate; and
    a surface-modification coating layer formed on the conductive layer, wherein the conductive layer is formed from an electrically conductive material and the surface-modification coating layer is formed from a compound represented by Formula 1:

$$H\diagdown_{X_1}\!\!\left(\!\!\diagup\diagdown\!\!{X_2}\!\!\right)_{\!\!n}\!\!-R \tag{1}$$

wherein
R is H or OH,
X$_1$ is S, Se or Te,
X$_2$ is O, Se or Te,
n is an integer from 2 to 40; and
wherein the electrode is in communication with a photoactive layer.

2. The surface-modified counter electrode according to claim 1, wherein the electrically conductive material is selected from the group consisting of platinum, gold, carbon, and carbon nanotubes.

3. The surface-modified counter electrode according to claim 2, wherein the electrically conductive material is platinum.

4. The surface-modified counter electrode according to claim 1, wherein X$_1$ is sulfur and X$_2$ is oxygen in Formula 1.

5. A photovoltaic device, comprising:
    a transparent semiconductor electrode comprising a substrate and a conductive material coated on the substrate;
    a light-absorbing layer formed on the transparent electrode having a dye adsorbed thereon;
    a counter electrode disposed opposite to the semiconductor electrode; and
    a redox electrolyte layer formed between the transparent semiconductor electrode and the counter electrode, wherein the counter electrode comprises a surface-modification coating layer formed from a compound represented by Formula 1:

$$H\diagdown_{X_1}\!\!\left(\!\!\diagup\diagdown\!\!{X_2}\!\!\right)_{\!\!n}\!\!-R \tag{1}$$

wherein
R is H or OH,
X$_1$ is S, Se or Te,
X$_2$ is O, Se or Te, and
n is an integer from 2 to 40.

6. The photovoltaic device according to claim 5, wherein the electrolyte layer comprises a solid electrolyte or a gel-type electrolyte containing ions that undergo redox reactions.

* * * * *